US009626109B2

(12) United States Patent
Katsurayama et al.

(10) Patent No.: US 9,626,109 B2
(45) Date of Patent: Apr. 18, 2017

(54) SYSTEM AND METHOD FOR MANAGING THE OPERATING PARAMETER OF A NONVOLATILE MEMORY

(71) Applicant: KABUSHIKI KAISHA TOSHIBA, Minato-ku (JP)

(72) Inventors: Hironori Katsurayama, Yokohama (JP); Takanobu Okuno, Kawasaki (JP); Daisuke Nakata, Kamakura (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 4 days.

(21) Appl. No.: 14/718,536

(22) Filed: May 21, 2015

(65) Prior Publication Data

US 2016/0170643 A1     Jun. 16, 2016

Related U.S. Application Data

(60) Provisional application No. 62/090,708, filed on Dec. 11, 2014.

(51) Int. Cl.
| | |
|---|---|
| G06F 12/02 | (2006.01) |
| G06F 3/06 | (2006.01) |
| G06F 12/06 | (2006.01) |
| G11C 16/20 | (2006.01) |
| G11C 5/14 | (2006.01) |
| G11C 29/02 | (2006.01) |
| G11C 29/44 | (2006.01) |

(52) U.S. Cl.
CPC ............ *G06F 3/061* (2013.01); *G06F 3/0655* (2013.01); *G06F 3/0685* (2013.01); *G06F 3/0688* (2013.01); *G06F 12/0238* (2013.01); *G06F 12/0246* (2013.01); *G06F 12/0638* (2013.01); *G11C 16/20* (2013.01); *G11C 29/028* (2013.01); *G06F 2212/205* (2013.01); *G11C 5/148* (2013.01); *G11C 29/023* (2013.01); *G11C 2029/4402* (2013.01)

(58) Field of Classification Search
CPC ............ G06F 12/0238; G06F 12/0246; G11C 11/1673
USPC .............................. 711/102, 103; 365/210.12
See application file for complete search history.

(56) References Cited

U.S. PATENT DOCUMENTS

2009/0154244 A1 *  6/2009  Shiga ...................... 365/185.11
2011/0119431 A1    5/2011  Chowdhury
(Continued)

FOREIGN PATENT DOCUMENTS

| JP | 2009-230206 | 10/2009 |
|---|---|---|
| JP | 2011-107851 | 6/2011 |
| JP | 2012-178194 | 9/2012 |

*Primary Examiner* — Than Nguyen
(74) *Attorney, Agent, or Firm* — Oblon, McClelland, Maier & Neustadt, L.L.P.

(57) ABSTRACT

A memory system according to the present embodiment includes a nonvolatile memory part storing an operating parameter required to perform a data read operation or a data write operation. A volatile memory part holds the operating parameter read out from the nonvolatile memory part after turning power on. A controller writes back the operating parameter in the volatile memory part to a first position of the nonvolatile memory part storing the operating parameter, based on number of times of power input to the volatile memory part, number of times of reading the operating parameter, or a read time of the operating parameter.

8 Claims, 4 Drawing Sheets

(56) References Cited

U.S. PATENT DOCUMENTS

2012/0069634 A1* 3/2012 Saito .......................... 365/149
2012/0221773 A1 8/2012 Shuto et al.

\* cited by examiner

SYSTEM AND METHOD FOR MANAGING THE OPERATING PARAMETER OF A NONVOLATILE MEMORY

CROSS REFERENCE TO RELATED APPLICATIONS

This application is based upon and claims the benefit of priority from the prior U.S. Provisional Patent Application No. 62/090,708, filed on Dec. 11, 2014, the entire contents of which are incorporated herein by reference.

FIELD

The embodiments of the present invention relate to a memory system and a driving method thereof.

BACKGROUND

When an electric device is in a standby state or the like, there is a case where the electric device disconnects the device itself or a memory system in a memory card from a power supply in order to suppress consumption power of the device. In this case, when the electric device returns from the standby state to a startup state, the memory system is connected to the power supply, and reads out an operating parameter from a nonvolatile memory to a volatile memory (hereinafter, also "cache"). The operating parameter is basic information for defining operating conditions such as a word line voltage and a bit line voltage in a read operation, a write operation, or an erase operation in a memory chip. The operating parameter is stored in advance in the nonvolatile memory in the memory system, and is read out to a volatile cache (a register) in the memory chip so that a high-speed access can be made when the power is turned on. This read operation of the operating parameter is called POR (Power On Read). When the memory system is operated, the memory chip is operated according to the operating parameter stored in the cache.

However, when turning on and turning off of the power of the memory system or the memory chip are repeated, the number of times of POR is increased, and thus read disturb is caused on the nonvolatile memory having an operating parameter stored therein. When a wrong operating parameter is read out to the cache due to the read disturb, the memory system cannot be operated normally.

To handle such a problem, there is a case where the same operating parameters are stored in a plurality of positions of a nonvolatile memory. When an operating parameter of a certain position is broken, the memory system reads out an operating parameter stored in another position. However, in this case, when many operating parameters are broken, the memory system needs to access many positions in the nonvolatile memory for many times, causing a problem that a long time is taken to read out the operating parameter to the cache.

DETAILED DESCRIPTION

Embodiments will now be explained with reference to the accompanying drawings. The present invention is not limited to the embodiments.

A memory system according to the present embodiment includes a nonvolatile memory part storing an operating parameter required to perform a data read operation or a data write operation. A volatile memory part holds the operating parameter read out from the nonvolatile memory part after turning power on. A controller writes back the operating parameter in the volatile memory part to a first position of the nonvolatile memory part storing the operating parameter, based on number of times of power input to the volatile memory part, number of times of reading the operating parameter, or a read time of the operating parameter.

First Embodiment

Figure 1:
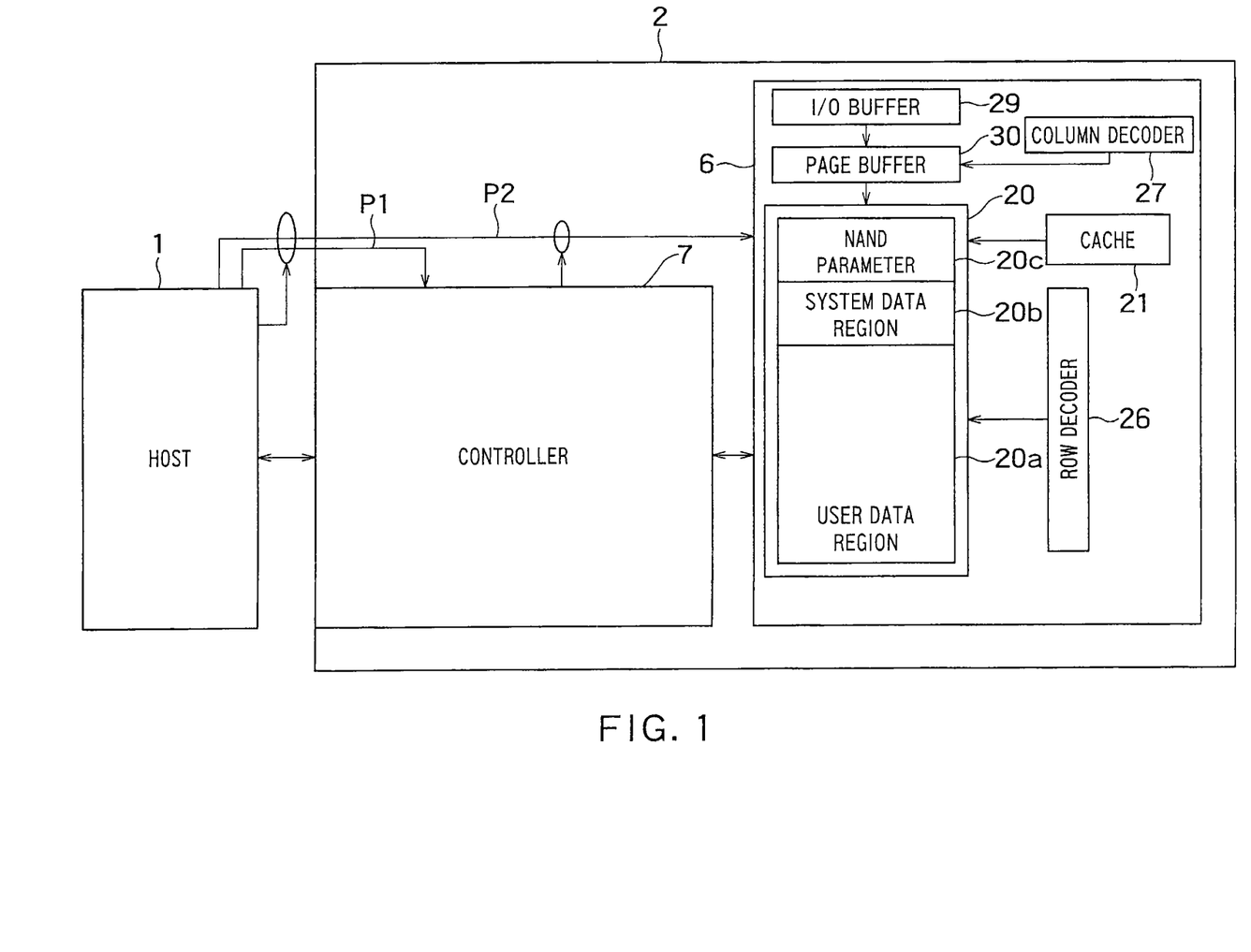
FIG. 1 is a block diagram showing an example of a configuration of a memory card 2 according to a first embodiment.

FIG. 1 is a block diagram showing an example of a configuration of a memory card 2 according to a first embodiment. Each block can be realized as hardware or software, or as a combination of both. In FIG. 1, a host 1 is a device such as a portable terminal or a personal computer, and includes hardware and software for making an access to the memory card 2. The memory card 2 is, for example, a memory system having a NAND flash memory incorporated therein. However, the first embodiment is not limited to NAND flash memories, and can be also applied to other types of memories.

The memory card 2 as a memory system is a storage medium attachable to the host 1, and is, for example, a memory card such as an e-MMC (embedded Multi Media Card). The memory card 2 performs an initializing operation upon reception of power supply when the host 1 is connected to the memory card 2. Thereafter, the memory card 2 performs a write operation, a read operation, or an erase operation according to a command from the host 1. The memory card 2 includes a memory part 6 and a controller 7. The memory part 6 is, for example, a NAND chip, and includes a nonvolatile memory part 20, a volatile memory part 21, a row decoder 26, a column decoder 27, a page buffer 30, and an I/O buffer 29.

The nonvolatile memory part 20 is, for example, a nonvolatile memory such as a NAND flash memory that stores therein data in a nonvolatile state. The nonvolatile memory part 20 performs read and write of data in a unit referred to as "page", which is constituted by a plurality of memory cells. Each of the memory cells is connected to a word line and a bit line. Data can be written in the memory cells or can be read out therefrom by selectively applying or not applying power to the word line and the bit line. A unique physical address is allocated to respective pages. The nonvolatile memory part 20 performs data erasure in a unit referred to as "physical block", which is constituted by a plurality of pages. A physical address can be allocated in a unit of physical blocks. The nonvolatile memory part 20 can maintain data in a nonvolatile state even when a power supply P2 is disconnected by the host 1 or the controller 7.

The nonvolatile memory part 20 includes a user data region 20a, a system data region 20b, and a parameter region 20c. The user data region 20a is a memory region that a user can freely use to store data therein, and is, for example, a region in which data can be written from outside of the memory card 2 by using the host 1, or from which data can be read out to outside of the memory card 2.

The system data region 20b is a memory region in which information required for the controller 7 to operate the memory part 6 is stored, and is a region in which system data (such as an address conversion table and controller-operation setting information) required to perform a data write operation and a data read operation is stored. The system data is read out from the memory part 6 to the controller 7 when power is turned on, and is held in the controller 7. The controller 7 reads out data from a predetermined memory region in the memory part 6 by using system data, and writes data in a predetermined memory region in the memory part 6. Alternatively, the controller 7 erases data in a predetermined memory region in the memory part 6.

The parameter region 20c is a memory region in which an operating parameter (hereinafter, also "NAND parameter") required to operate the nonvolatile memory part 20 in the memory part 6 is stored, and is a region in which basic information (operating conditions) required to perform operations such as a data write operation and a data read operation in the memory part 6 is stored. The NAND parameter is, for example, a word line voltage, a bit line voltage, or a voltage application time. That is, the NAND parameter is basic information for defining operating conditions in the memory part (the memory chip) 6.

When power is turned on, the NAND parameter is read out from the parameter region 20c in the memory part 6 to the volatile memory part 21 in the memory part 6. Subsequently, when read, write, or erase of data is performed, the memory part 6 drives the word line, the bit line, and the like based on conditions according to the NAND parameter stored in the volatile memory part 21.

The system data region 20b further stores therein the number of times of power input to the volatile memory part 21 as a cache memory part or the number of times of reading the NAND parameter from the parameter region 20c. The system data region 20b further stores therein a threshold of the number of times of power input to the volatile memory part 21 or a threshold of the number of times of reading the NAND parameter. The number of times of power input or the number of times of reading the NAND parameter and these thresholds are, as described later, used to determine whether a rewrite operation (a refresh operation) of the NAND parameter is to be performed.

In order to prohibit rewriting of basic information such as a NAND parameter, the parameter region 20c cannot be accessed from outside of the memory system 2. That is, the host 1 (that is, a user) located outside of the memory system 2 cannot access the parameter region 20c.

The volatile memory part 21 includes, for example, a volatile memory such as an SRAM (Static Random Access Memory). After power is turned on and when an initializing operation is performed, the volatile memory part 21 as a cache memory part holds a NAND parameter read out from the nonvolatile memory part 20. The controller 7 uses the volatile memory part 21 as a cache to control operations of the memory part 6 according to the NAND parameter held in the volatile memory part 21. While the volatile memory part 21 can be accessed by the controller 7 with a high speed, when the power supply P2 is disconnected by the host 1 or the controller 7, the volatile memory part 21 cannot maintain data stored therein, and the data is lost.

The row decoder 26 selects, in a data write operation or a data read operation, a word line of the nonvolatile memory part 20 based on a row address. The column decoder 27 selects, in a data write operation or a data read operation, a bit line of the nonvolatile memory part 20 based on a column address. The I/O buffer 29 temporarily holds write data supplied from the controller 7 and outputs the data to the page buffer 30. Furthermore, the I/O buffer 29 temporarily holds read data received from the page buffer 30 and outputs the data to the controller 7. The page buffer 30 outputs the write data received from the I/O buffer 29 to the nonvolatile memory part 20, or outputs the read data received from the nonvolatile memory part 20 to the controller 7 via the I/O buffer 29.

The controller 7 controls a read operation, a write operation, and an erase operation of the memory part 6. Furthermore, the controller 7 manages the state of data storage by the flash memory part 6. For example, the controller 7 manages which physical address page (or physical block) is holding which logical address data allocated by the host 1, or manages which physical address page (or physical block) is in an erased state.

A user accesses the memory card 2 via the host 1. With this access, the user can store data in the memory card 2, or can read out data from the memory card 2.

The host 1 supplies power to the controller 7 and the memory part 6 of the memory card 2. The host 1 is configured to be capable of connecting and disconnecting a power supply P1 and the power supply P2 of the controller 7 and the memory part 6, respectively, by using hardware or software. The power supply P1 is a main power supply that supplies power to the controller 7, and the power supply P2 is a main power supply that supplies power to the memory part 6. For example, when a user attaches the memory card 2 to the host 1, or when a user turns on the power of the host 1, the host 1 supplies a power source to the memory card 2 from both the power supplies P1 and P2. After supplying power to the memory card 2 via the power supplies P1 and P2, the controller 7 outputs an initialization command (a POR command) to the memory part 6. Upon reception of the initialization command, as an initializing operation, the memory part 6 reads out a NAND parameter from the parameter region 20c of the nonvolatile memory part 20, and stores the NAND parameter in the volatile memory part 21. As mentioned above, the read operation of the NAND parameter from the parameter region 20c is referred to as "POR operation". With this process, the memory part 6 can perform a read operation, a write operation, or an erase operation to the user data region 20a by using the NAND parameter held in the volatile memory part 21. Furthermore, the controller 7 loads system data from the system data region 20b. The controller 7 receives the system data and stores the system data therein. With this process, the controller 7 can perform a read operation, a write operation, or an erase operation to the memory part 6 by using the system data.

Meanwhile, when a user detaches the memory card 2 from the host 1 or when a user stops (shuts down) the power to the host 1, both the power supplies P1 and P2 are disconnected from the memory card 2. In this case, although the NAND parameter stored in the nonvolatile memory part 20 is maintained, the NAND parameter held in the volatile memory part 21 is lost.

Furthermore, the controller 7 is configured to be capable of connecting and disconnecting the power supply P2 of the memory part 6 by using hardware or software. For example, even when the memory card 2 is attached to the host 1, when the memory card 2 is unused for a certain time period, the memory card 2 enters a standby state, and there is a case where the controller 7 disconnects the power supply P2.

Even in this case, although the NAND parameter stored in the nonvolatile memory part 20 is maintained, the NAND parameter held in the volatile memory part 21 is lost.

When the power supplies P1 and P2 (or only the power supply P2) are connected again after the power supplies P1 and P2 (or only the power supply P2) are disconnected, the memory part 6 is required to perform a POR operation again.

In the POR operation, the controller 7 outputs an initialization command to the memory part 6, and the memory part 6 accesses the system data region 20b of the nonvolatile memory part 20 to read out a NAND parameter to the volatile memory part 21. As described above, when the memory system 2 repeats connection and disconnection of the power supply P2 and/or the power supply P1, the number of times of performing the POR operation (or POR frequency) increases, and thus there is a case where read disturb is caused on the parameter region 20c, in which the NAND parameter is stored. The read disturb is a phenomenon in which a voltage stress is applied on memory cells due to a data read operation, thereby causing data garbling.

Therefore, the controller 7 of the memory card 2 according to the first embodiment counts the number of times of power input from the power supply P2 or the number of times of reading a NAND parameter. When the number of times of power input from the power supply P2 or the number of times of reading a NAND parameter (the number of times of outputting an initialization command) has become equal to or larger than a predetermined threshold, the controller 7 writes back the NAND parameter held in the volatile memory part 21 to the parameter region 20c of the nonvolatile memory part 20. With this process, the NAND parameter in the parameter region 20c that has been subjected to read disturb can be recovered. In the following descriptions, such a NAND parameter recovering operation is referred to as "refresh operation".

Figure 2:
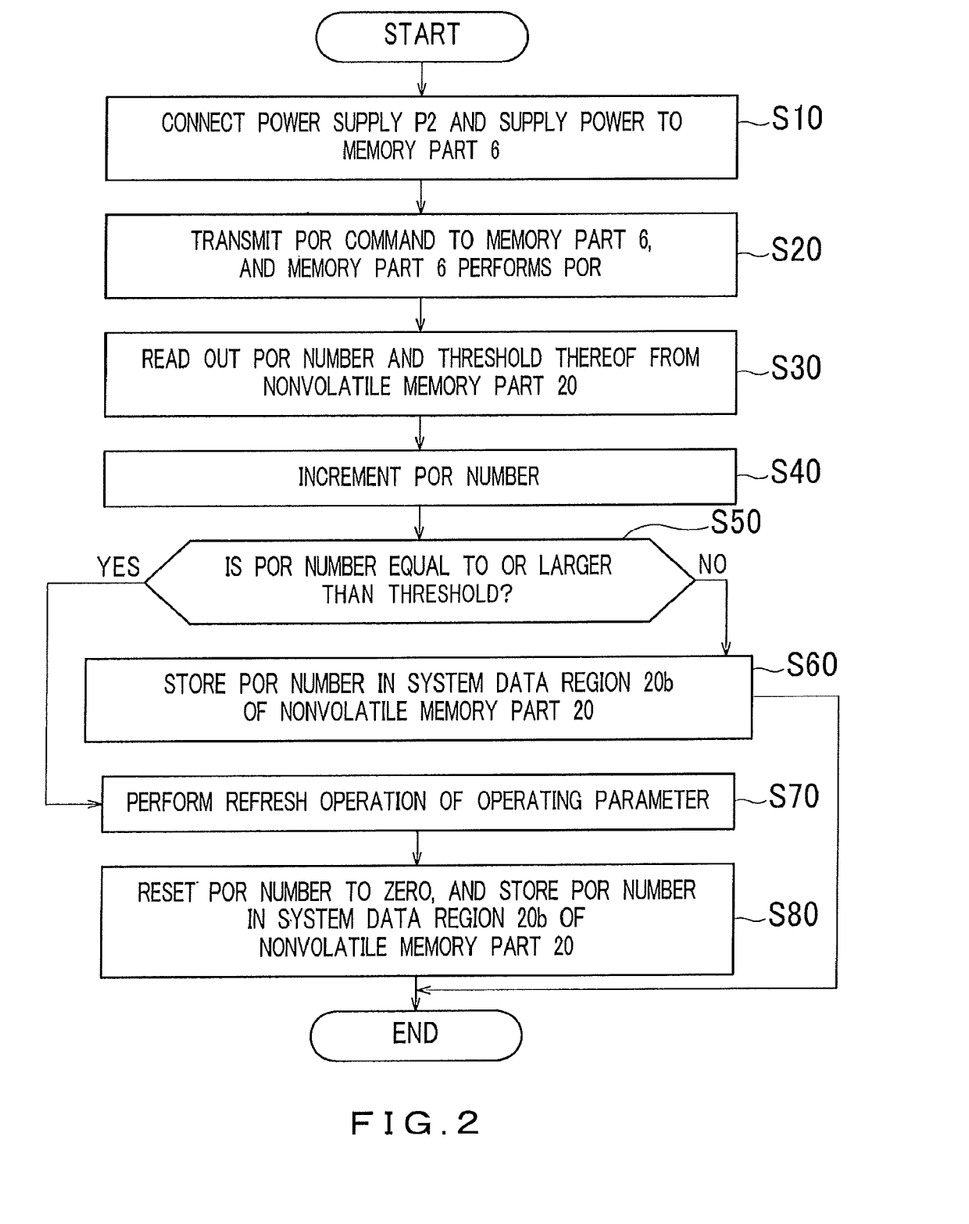
FIG. 2 is a flowchart showing an example of a refresh operation of a NAND parameter in the parameter region 20c.

FIG. 2 is a flowchart showing an example of a refresh operation of a NAND parameter in the parameter region 20c.

First, when the memory card 2 is attached to the host 1, the power supplies P1 and P2 are respectively connected to the memory card 2, and the host 1 supplies power to the memory card 2. Alternatively, when the memory card 2 attached to the host 1 has returned from a standby state, the controller 7 connects the power supply P2 to the memory card 2, and supplies power to the memory part 6 (S10).

Next, upon power supply to the memory part 6, the controller 7 transmits an initialization command (a POR command) to the memory part 6, and the memory part 6 performs a POR operation (S20). As the POR operation is performed, the NAND parameter is read out to the volatile memory part 21 as a cache from the parameter region 20c of the nonvolatile memory part 20. Furthermore, the controller 7 loads system data from the memory part 6. With this process, it becomes possible that the memory card 2 writes user data from outside (the host 1) of the memory card 2 to the user data region 20a of the nonvolatile memory part 20, or user data is read out from the user data region 20a to outside (the host 1) of the memory card 2.

Next, the controller 7 reads out the number of times of power input to the volatile memory part 21 or the number of times of reading a NAND parameter (the number of times of outputting a POR command), and a threshold of the number of times of power input to the volatile memory part 21 or that of the number of times of reading a NAND parameter (the number of times of outputting a POR command) (S30). In the first embodiment, the number of times of power input to the volatile memory part 21 is equal to the number of times of power input to the memory part 6 (that is, the number of times of power input to the nonvolatile memory part 20 and to the volatile memory part 21), and is also regarded as the number of times of connecting the power supply P2 to the memory part 6. The number of times of power input to the memory part 6 includes the number of times that the controller 7 connecting the power supply P2 to the memory part 6 (such as the number of times that the memory card 2 returning from a standby state) and the number of times that the host 1 connecting the power supplies P1 and P2 to the memory card 2 (such as the number of times of attaching the memory card 2 to the host 1 and that of power input to the host 1). That is, the number of times of power input to the memory part 6 is a sum of the number of times of power input from the power supplies P1 and P2 to the whole of the controller 7, the nonvolatile memory part 20, and the volatile memory part 21 and the number of times of power input from the power supply P2 to the nonvolatile memory part 20 and the volatile memory part 21.

Because a POR operation is performed each time power is input to the memory part 6, the number of times of reading a NAND parameter from the system data region 20b (that is, the number of times of outputting a POR command) is equal to the number of times of power input to the memory part 6. Therefore, in the following descriptions, the number of times of reading a NAND parameter and that of power input to the memory part 6 is also collectively referred to as "POR number".

Next, the controller 7 increments the POR number only by one (S40). At this time, it suffices that the controller 7 increments the POR number only by one based on issuance of a POR command. That is, when power is input to the memory part 6 or when a POR operation is performed, the controller 7 reads out the POR number from the nonvolatile memory part 20 to increment the POR number.

Next, the controller 7 compares the POR number to a threshold (S50). When the POR number is less than a threshold (NO at S50), the controller 7 stores the POR number incremented at Step S40 in the system data region 20b of the nonvolatile memory part 20 (S60). In this case, the controller 7 does not perform a refresh operation of a NAND parameter, and the host 1 can access the user data region 20a of the memory card 2.

Meanwhile, when the POR number is equal to or larger than the threshold (YES at S50), the controller 7 performs a refresh operation of a NAND parameter (S70). That is, as described above, the controller 7 once reads out a NAND parameter held in the volatile memory part 21 as a cache memory, and writes back the NAND parameter to the parameter region 20c of the nonvolatile memory part 20. At this time, the controller 7 writes back the NAND parameter to the same position (the same physical address) in the parameter region 20c where NAND parameters are stored. That is, the controller 7 writes back the NAND parameter to the position (a first position) in the parameter region 20c where access has been made with the POR operation at Step S20. When the NAND parameter is stored in a plurality of positions in the parameter region 20c, the controller 7 refreshes operating parameters of these positions. With this process, the controller 7 refreshes a NAND parameter in the parameter region 20c that has been read out to perform a POR operation, thereby recovering data of a NAND parameter that has been subjected to read disturb.

Furthermore, the controller 7 resets the POR number as zero, and stores the POR number in the system data region 20b of the nonvolatile memory part 20 (S80).

Thereafter, when the memory card 2 is detached from the host 1 and the host 1 is shut down, or when the memory card 2 is in a standby state, the power supply P2 of the memory part 6 is disconnected, and the NAND parameter of the volatile memory part 21 is lost.

Subsequently, when the memory card 2 is attached to the host 1 again and power is input to the host 1, or when the memory card 2 returns from the standby state, the power supply P2 is connected to the memory part 6, and then Steps S10 to S80 described above are performed. At this time, the NAND parameter in the parameter region 20c has already been refreshed, so that the controller 7 can read out a correct NAND parameter to the volatile memory part 21. In this manner, according to the first embodiment, it is possible to suppress influences of read disturb on the NAND parameter held in the nonvolatile memory part 20 and to suppress erroneous reading of NAND parameters and extension of a read time of NAND parameters.

Figure 3:
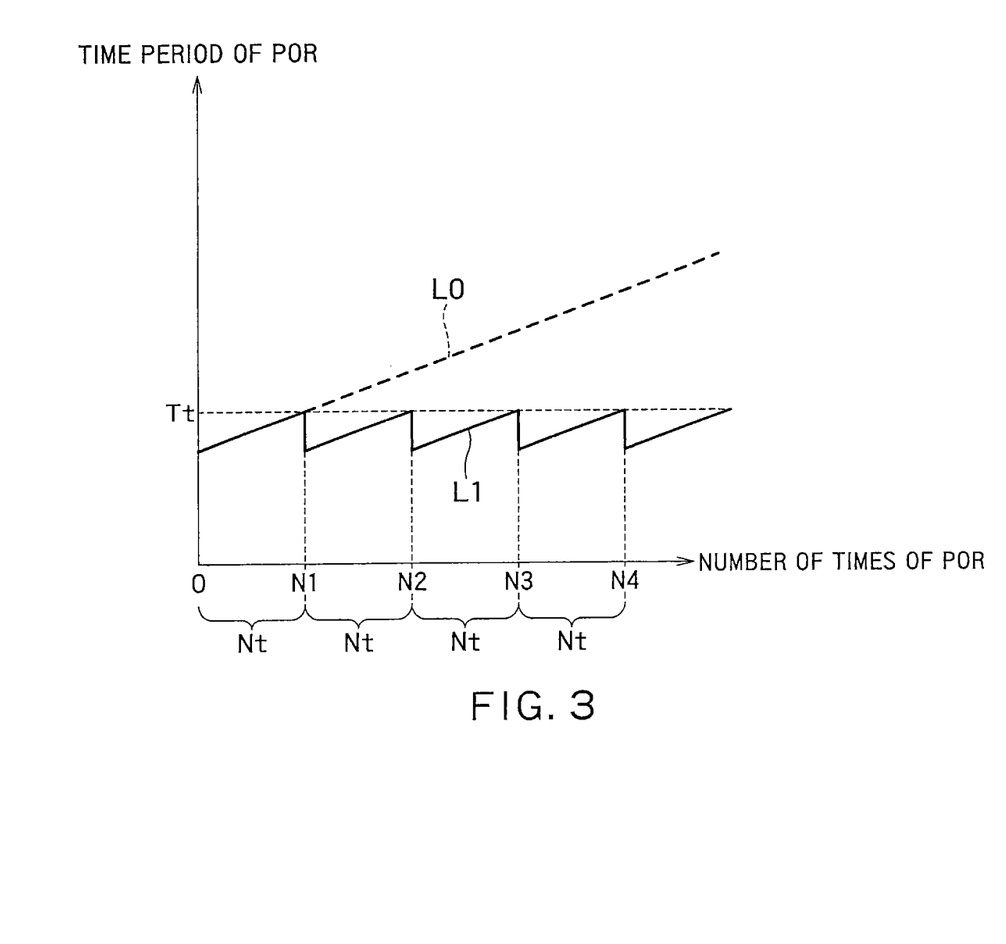
FIG. 3 is a graph showing a relationship between a POR number and a time required to perform a POR operation.

FIG. 3 is a graph showing a relationship between a POR number and a time required to perform a POR operation. The horizontal axis represents a POR number and the vertical axis represents a time required to perform a POR operation (hereinafter, "POR time"). A line L0 represents a relationship between the POR number and the POR time when no refresh operation is performed. A line L1 represents a relationship between the POR number and the POR time when a refresh operation is performed.

As indicated by the line L0, when a refresh operation is not performed, the POR time is increased as the POR number is increased. A NAND parameter is stored in many positions in a nonvolatile memory, and when a NAND parameter of a certain position is broken, the memory system reads out a NAND parameter of another position. Therefore, when many NAND parameters in the nonvolatile memory are broken, the memory system needs to access many positions in the nonvolatile memory for many times, so that it takes a long time to perform a POR operation. Furthermore, when NAND parameters of all write positions in the nonvolatile memory are broken, there is a case where the POR operation itself cannot be performed (that is, time-out).

In contrast, in the first embodiment, as indicated by the line L1, the controller 7 performs a refresh operation each time the POR number reaches a threshold Nt. When the POR number reaches the threshold Nt, the controller 7 resets the POR number to zero. That is, the controller 7 performs a refresh operation each time the total number of times of POR reaches any one of thresholds N1, N2, N3, N4, and onwards. With this refresh operation, when the total number of times of POR is any of the thresholds N1, N2, N3, N4, and onwards, the POR time (time period of POR) is reduced and the POR time becomes substantially equal to the POR time when the POR number is zero. This is because the controller 7 writes back a NAND parameter to the nonvolatile memory part 20 to recover the data of the NAND parameter.

As described above, the memory system according to the first embodiment writes back a NAND parameter in the volatile memory part 21 to the nonvolatile memory part 20, based on the number of times of power input to the memory part 6 (or the volatile memory part 21) or the number of times of reading the NAND parameter. At this time, the controller 7 writes back the NAND parameter to the same position in the nonvolatile memory part 20 having NAND parameters stored therein. That is, the controller 7 refreshes NAND parameters. When NAND parameters are stored in a plurality of positions in the parameter region 20c, the controller 7 refreshes the NAND parameters of these positions. With this process, the NAND parameter in the nonvolatile memory part 20 is recovered, and it is possible to suppress read disturb of NAND parameters. Accordingly, erroneous reading of NAND parameters and extension of a read time of NAND parameters can be suppressed.

Second Embodiment

Figure 4:
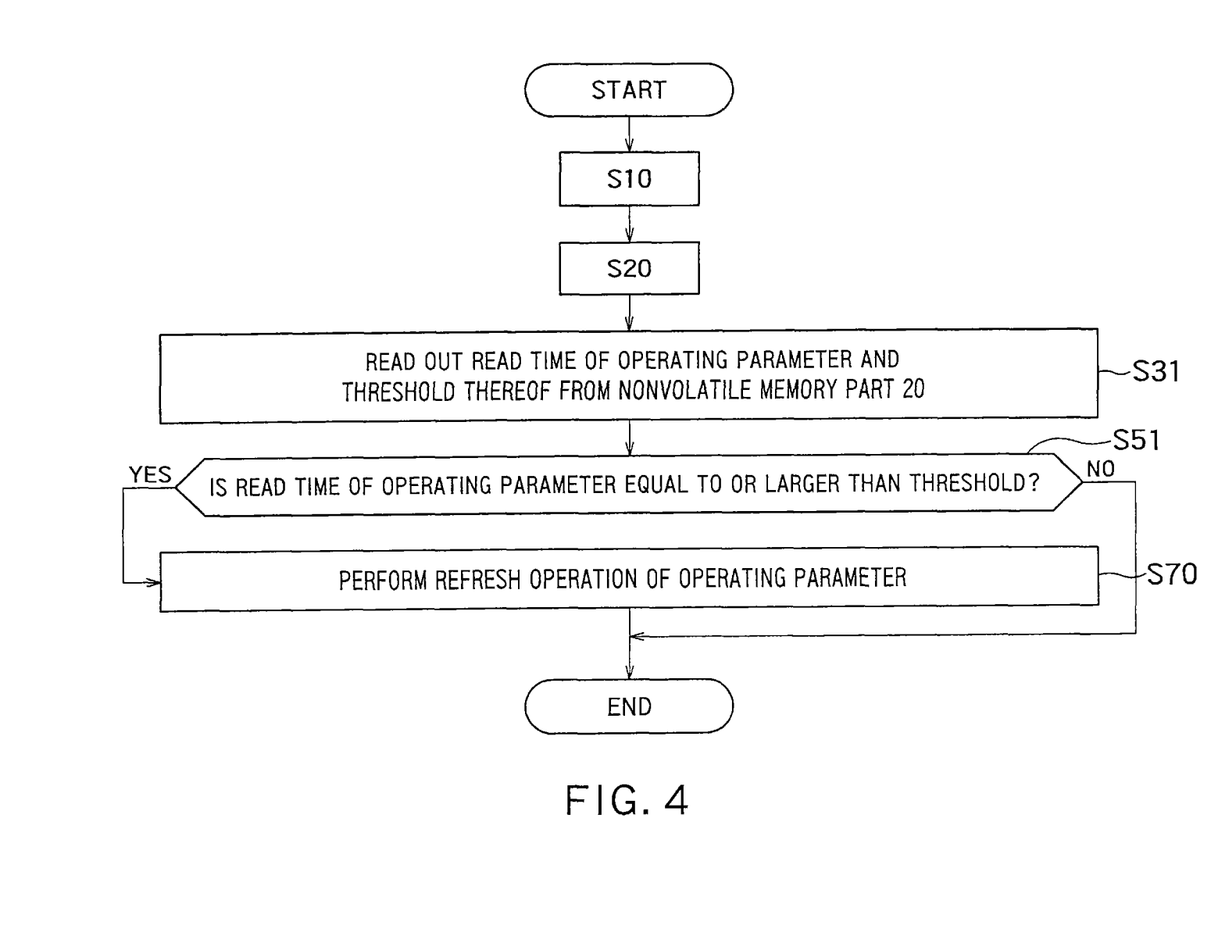
FIG. 4 is a flowchart showing an example of a refresh operation of a NAND parameter in the parameter region 20c according to a second embodiment.

FIG. 4 is a flowchart showing an example of a refresh operation of a NAND parameter in the parameter region 20c according to a second embodiment. In the second embodiment, the controller 7 performs a write back operation of a NAND parameter in the volatile memory part 21 to the nonvolatile memory part 20 based on a read time (a POR time, or a time period of POR) of the NAND parameter. For example, when the POR time becomes equal to or longer than a predetermined threshold (for example, Tt in FIG. 3), the controller 7 writes back a NAND parameter held in the volatile memory part 21 to the system data region 20b of the nonvolatile memory part 20. With this process, it is possible to recover a NAND parameter in the parameter region 20c that has been subjected to read disturb.

It suffices that the controller 7 measures a time period (a POR time) when a NAND parameter is read out from the nonvolatile memory part 20 to the volatile memory part 21, by using an external clock obtained from the host 1 or an internal clock generated in the memory card 2. Other configurations of the memory system according to the second embodiment can be identical to corresponding configurations of the memory system according to the first embodiment.

In a recovery operation of a NAND parameter of the parameter region 20c according to the second embodiment, Steps S10 and S20 are performed first.

Next, the controller 7 reads out a read time of a NAND parameter and a threshold of the read time from the nonvolatile memory part 20 (S31). In the second embodiment, the read time (the POR time) of the NAND parameter is a time when the NAND parameter is read out from the nonvolatile memory part 20 to the volatile memory part 21.

Next, the controller 7 compares the POR time to a threshold (S51). In this case, as shown in FIG. 3, as the threshold of the POR time is denoted as Tt, the controller 7 compares the POR time to the threshold Tt. When the POR time is shorter than the threshold Tt (NO at S51), the controller 7 does not perform a refresh operation, and the host 1 can access the user data region 20a of the memory card 2.

When the POR time is equal to or longer than the threshold Tt (YES at S51), as shown in Step S70, the controller 7 performs a refresh operation of the NAND parameter. With this process, similarly to the first embodiment, the controller 7 refreshes the NAND parameter in the parameter region 20c read out to perform a POR operation, thereby recovering data of a NAND parameter that has been subjected to read disturb.

Thereafter, when the memory card 2 is detached from the host 1 and the host 1 is shut down, or when the memory card 2 is in a standby state, the power supply P2 of the memory part 6 is disconnected, and the NAND parameter of the volatile memory part 21 is lost.

Subsequently, when the memory card 2 is attached to the host 1 again and power is input to the host 1, or when the memory card 2 returns from the standby state, the power supply P2 is connected to the memory part 6, and then Steps S10 to S51 described above are performed.

In this manner, the controller 7 can write back the NAND parameter in the volatile memory part 21 to the nonvolatile memory part 20 based on the POR time. At this time, the controller 7 writes back the NAND parameter to the same position (the same physical address) of the nonvolatile memory part 20 where NAND parameters are stored. In this manner, the second embodiment can achieve effects identical to those of the first embodiment.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A memory system comprising:
a nonvolatile memory part storing an operating parameter required to perform a data read operation or a data write operation;
a volatile memory part holding the operating parameter read out from the nonvolatile memory part after turning power on; and
a controller writing back the operating parameter in the volatile memory part to a first position of the nonvolatile memory part storing the operating parameter, based on a number of times of power input to the volatile memory part or a number of times of reading the operating parameter, wherein
the nonvolatile memory part stores the number of times of power input or the number of times of reading the operating parameter in a second position thereof, and
the controller reads out the number of times of power input or the number of times of reading the operating parameter from the nonvolatile memory part when power is input to the volatile memory part or when the operating parameter is read out, and
the controller writes back the number of times of power input or the number of times of reading the operating parameter into the second position of the nonvolatile memory part after incrementing the number of times of power input or the number of times of reading the operating parameter.

2. The memory system of claim 1, wherein the controller writes back the operating parameter in the volatile memory part into the first position of the nonvolatile memory part when the number of times of power input to the volatile memory part, the number of times of reading the operating parameter, or a read time of the operating parameter becomes equal to or larger than a predetermined threshold.

3. The memory system of claim 1, wherein the operating parameter is information for defining at least a word line voltage and a bit line voltage required to perform a read operation of data stored in the nonvolatile memory part or a write operation of data to the nonvolatile memory part.

4. The memory system of claim 1, wherein the controller reads out data stored in the nonvolatile memory part or writes data in the nonvolatile memory part by using the operating parameter stored in the volatile memory part.

5. A driving method of a memory system, wherein
the memory system comprises a nonvolatile memory part and a volatile memory part, the nonvolatile memory part storing an operating parameter required to perform a data read operation or a data write operation in a first position thereof and storing a number of times of power input to the volatile memory part or a number of times of reading the operating parameter written in a second position thereof, the volatile memory part holding the operating parameter read out from the nonvolatile memory part, and
the method comprises:
reading out the number of times of power input or the number of times of reading the operating parameter from the nonvolatile memory part when power is input to the volatile memory part or when the operating parameter is read out;
incrementing the number of times of power input or the number of times of reading the operating parameter;
writing back the number of times of power input that has been incremented or the number of times of reading the operating parameter that has been incremented into the second position of the nonvolatile memory part; and
writing back the operating parameter in the volatile memory part into the first position of the nonvolatile memory part storing the operating parameter, based on the number of times of power input to the volatile memory part or the number of times of reading the operating parameter.

6. The method of claim 5, further comprising:
comparing the number of times of power input to the volatile memory part or the number of times of reading the operating parameter to a predetermined threshold; and
writing back the operating parameter in the volatile memory part into the first position of the nonvolatile memory part when the number of times of power input or the number of times of reading the operating parameter exceeds the threshold.

7. The method of claim 5, wherein the operating parameter is information for defining at least a word line voltage and a bit line voltage required to perform a read operation of data stored in the nonvolatile memory part or a write operation of data to the nonvolatile memory part.

8. The method of claim 5, further comprising reading out data stored in the nonvolatile memory part to outside of the memory system or writing data to the nonvolatile memory part from outside of the memory system by using the operating parameter stored in the volatile memory part.

* * * * *